United States Patent [19]

Patel

[11] Patent Number: 5,073,891

[45] Date of Patent: Dec. 17, 1991

[54] METHOD AND APPARATUS FOR TESTING MEMORY

[75] Inventor: Piyush G. Patel, Fremont, Calif.

[73] Assignee: Intel Corporation, Santa Clara, Calif.

[21] Appl. No.: 479,624

[22] Filed: Feb. 14, 1990

[51] Int. Cl.$^5$ .............................................. G11C 29/00
[52] U.S. Cl. .................................. 371/21.3; 371/21.1
[58] Field of Search .................... 371/21.2, 21.1, 21.3, 371/10.1, 10.2, 13, 25.1; 365/201

[56] References Cited

U.S. PATENT DOCUMENTS

| | | | |
|---|---|---|---|
| 4,402,081 | 8/1983 | Ichimiya et al. | 371/27 |
| 4,506,364 | 3/1985 | Aichelmann, Jr. et al. | 371/13 |
| 4,541,090 | 9/1985 | Shiragasawa | 371/21.2 |
| 4,586,181 | 4/1986 | Shimizu | 371/27 |
| 4,701,919 | 10/1987 | Naitoh et al. | 371/27 |
| 4,797,886 | 1/1989 | Imada | 371/27 |
| 4,841,525 | 6/1989 | Lieske et al. | 371/21.3 |
| 4,872,168 | 10/1989 | Aadsen et al. | 371/21.3 |
| 4,885,748 | 12/1989 | Hoffmann et al. | 371/21.3 |
| 4,891,811 | 1/1990 | Ash et al. | 371/21.2 |

OTHER PUBLICATIONS

Smith, Alan J., *Cache Memories*, Computing Surveys, vol. 14, No. 3, pp. 473–530 (Sep. 1982).

Primary Examiner—Jerry Smith
Assistant Examiner—Phung My Chung
Attorney, Agent, or Firm—Blakely, Sokoloff, Taylor & Zafman

[57] ABSTRACT

A method and apparatus for testing the integrity of a memory storing controlled information. The data array semiconductor memory that stores controlled information such as instructions or microcodes, is partitioned into two halves. One half stores the test pattern information, the other half stores the test program. An instruction test (I-TEST) instruction is provided for testing the instruction cache data array. The test program comprises a pair of I-TEST instruction and checkerboard pattern forming an instruction equivalent to the width of the data array. The I-TEST instruction runs in dual instruction mode with a floating point instruction replaced by the test pattern. The I-TEST program is executed by transferring its test pattern data from the instruction cache data array to a register R1 in the register file, and then comparing that data with the expected value located in a register other than R1 in the register file. If any comparison fails, then a defect in the data array will have been detected. To fully cover the data array, the I-TEST program must be repeated with test patterns located in the other half of the data array and swapped by a swapper which is coupled to the data array. The swapping action is accomplished by simply aligning the I-TEST instruction on the odd eight-byte boundaries rather than the even byte boundary.

7 Claims, 4 Drawing Sheets

METHOD AND APPARATUS FOR TESTING MEMORY

BACKGROUND OF THE INVENTION

1. Field of the Invention

The invention relates to semiconductor memories, and in particular to a method and apparatus for testing the integrity of memory storing controlled information.

2. Art Background

In semiconductor memories, such as static and dynamic random-access memories (RAMs), predetermined data patterns are used to test the memory for defects. In general, data patterns such as checkerboard, complement of checkerboard, walking 1's, walking 0's, crossing 1's or crossing 0's are written and read from each array of memory and compared with the expected values. However, for memories that store controlled information such as, an instruction cache or a programmable random read only memory (PROM) used on-chip with a central processor unit (CPU), or Microcode ROM; the prior art method of testing memory is unworkable because the binary patterns from such memory that stores controlled information means something other than the binary numbers. Furthermore, for normal operation of an instruction cache, there is no need to write into the instruction cache. The instructions are brought in during the instruction cache miss during replace cycles and then read by the integer execution unit or the floating point control units. The integer execution unit or the floating point control unit does not write into the instruction cache directly. As such, extra hardware is required to allow the writing by the integer execution unit into the instruction cache for testing the instruction cache.

Another problem related to the testing of instruction cache is that it requires a special mode which permits the simultaneous reading of the test pattern from the instruction cache and bypassing the instruction cache. This arises because the integer execution unit requires instruction for generating control for handling test pattern reading and performing comparison functions at the same time. The special mode with dedicated hardware is needed to accomplish this testing function. Over-all, the cost of extra hardware and special mode logic complexity needed for testing memory that stores controlled information is significant.

It is therefore an object of the present invention to provide a method and apparatus for testing the memory storing controlled information with minimal hardware overhead and simple software instructions.

It is yet another object of the present invention to partition the memory array into two halves and be able to load instruction in one half and test pattern into the other half in performing a testing of the memory with minimal hardware.

It is yet another object of the present invention to swap one-half of a memory array divided into two halves and compare the other half with an expected value in testing the integrity of the memory.

SUMMARY OF THE INVENTION

A method and apparatus for testing the integrity of a memory storing controlled information is disclosed. The data array semiconductor memory that stores controlled information such as instructions or microcodes, is partitioned into two halves. One half stores the test pattern information, the other half stores the test program. An instruction test (I-TEST) instruction is provided for testing the instruction cache data array. The test program comprises a pair of I-TEST instruction and checkerboard pattern forming an instruction equivalent to the width of the data array. The I-TEST instruction runs in dual instruction mode with a floating point instruction replaced by the test pattern. The I-TEST program is executed by transferring its test pattern data from the instruction cache data array to a register R1 in the register file, and then comparing that data with the expected value located in a register other than R1 in the register file. If any comparison fails, then a defect in the data array will have been detected. To fully cover the data array, the I-TEST program must be repeated with test patterns located in the other half of the data array and swapped by a swapper which is coupled to the data array. The swapping action is accomplished by simply aligning the I-TEST instruction on the odd eight-byte boundaries rather than the even byte boundary.

Other aspects of the present invention will be apparent from the following detailed description of the invention.

DETAILED DESCRIPTION OF THE INVENTION

Figure 1:
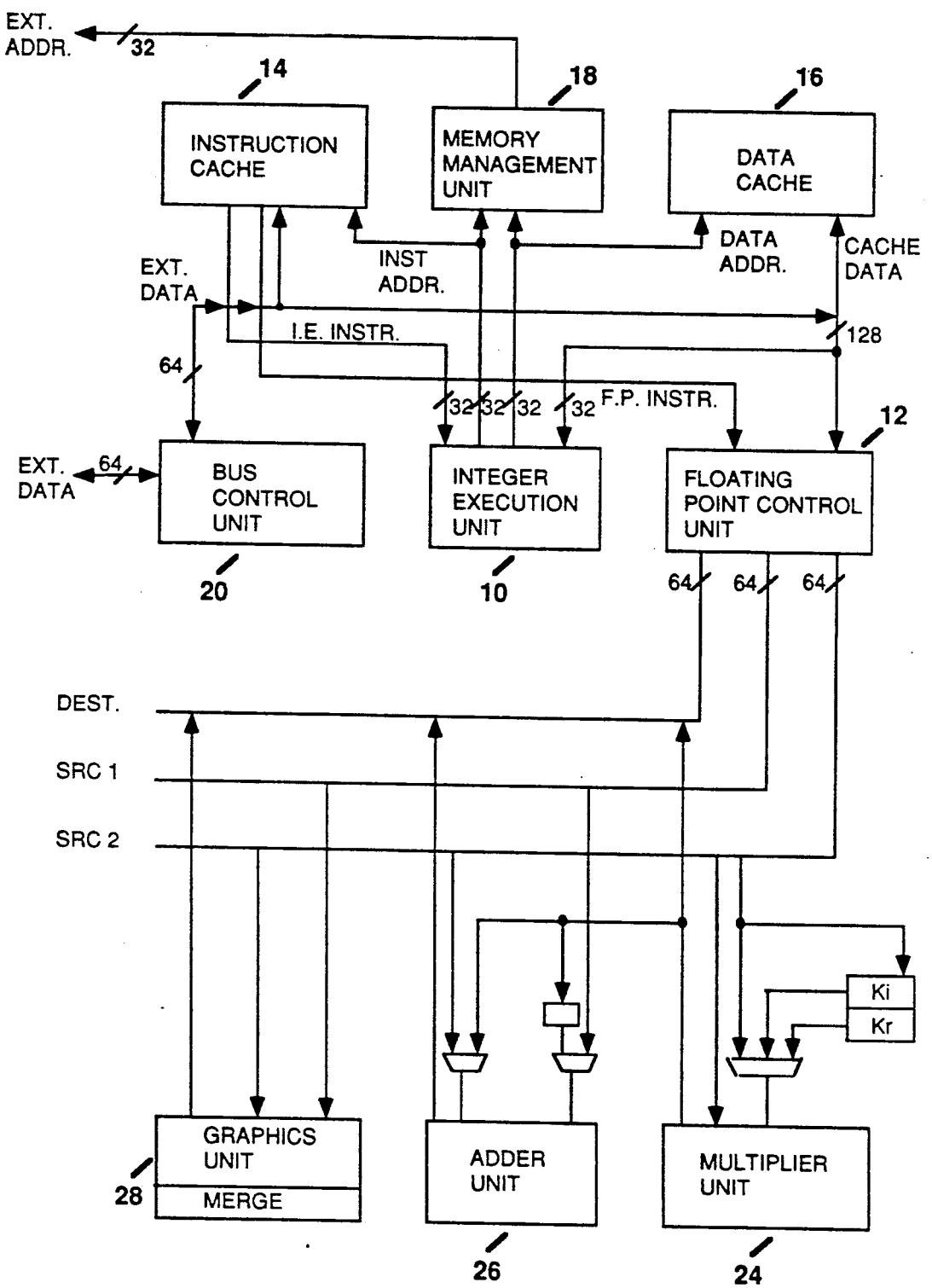
FIG. 1 is a block diagram of a processor featuring an instruction cache coupled to an integer execution unit and a floating point unit.

A swapper circuit and an instruction cache (I-TEST), program for use in testing a semiconductor memory is described. In the following description, numerous specific details are set forth such as specific gate logic, bit pattern, and program step, etc. in order to provide a thorough understanding of the present invention. It will be obvious to one skilled in the art that the present invention may be practiced without these specific details. In other instances, well-known circuits have been shown in symbolic form in order not to obscure the present invention with unnecessary detail.

NOTATION AND NOMENCLATURE

The detailed description which follows is presented partially in terms of algorithm and symbolic representation upon operations on data bits within the computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. These steps are those require physical manipulation of physical quantities. Usually, though not necessarily, these quantities take the form of electrical or magnetic signals capable of being stored, transferred, combined, and otherwise manipulated. It proves convenient at times, principally for reason of common usage, to refer to these signals as bits, values, elements, symbols, characters, terms, numbers or the like. It should be borne in mind, however, that all of these and similar terms are to be associated with the appropriate physical quantities and are merely convenient labels applied to these quantities.

Further, the manipulations performed are often referred to in terms such as adding or comparing, which are commonly associated with the mental operations performed by a human operator. No such capability of a human operator is necessary, or desirable. In most cases, in any of the operations described herein which form part of the present invention; the operation are machine operations. Useful machines for performing the operations of the present invention include general purpose digital computers or other similar devices such as processors. In all cases, it should be borne in mind that there is a distinction between the method operation in operating a computer and the method of computation itself. The present invention relates to method steps for operating a computer in processing electrical or other (for example, mechanical, chemical) physical signals to generate other desired physical signals.

The present invention also relates to an apparatus for performing these operations. This apparatus may be specially constructed for the required purpose or it may comprise a general purpose computer as selectively activated or reconfigured by a computer program stores in the computer. The algorithms presented herein are not inherently related to any particular computer or other apparatus. In particular, various general purpose machines may be used with programs written in accordance with the teachings herein, or it may prove more convenient to construct more specialized apparatus to perform required method steps. The required structure for a variety of these machines would appear from the description given below.

GENERAL SYSTEM CONFIGURATION

FIG. 1 shows a typical processor for processing and manipulating data and machine based instructions according to the present invention. Shown there is an integer execution unit 10 coupled to a floating point control unit 12. The integer execution unit 10 and the floating point control unit 12 are coupled to an instruction cache 14 and a data cache 16 for receiving instructions and data for further processing. Typically, in modern day processors, the integer execution unit is also coupled to a memory management unit 18 for transferring the addresses for the processed data. A bus control unit 20 is also coupled to the instruction cache 14 and data cache 16 as well as the floating point control unit 12 for transferring external data among the aforementioned units. Typically, the floating point control unit 12 is also coupled to a multiplier unit 24, an adder unit 26, and increasingly so to a graphics unit 28. Together, the above system is typically found in most general purpose computers, inside of a microprocessor, and in almost all special purpose computers.

Figure 2:
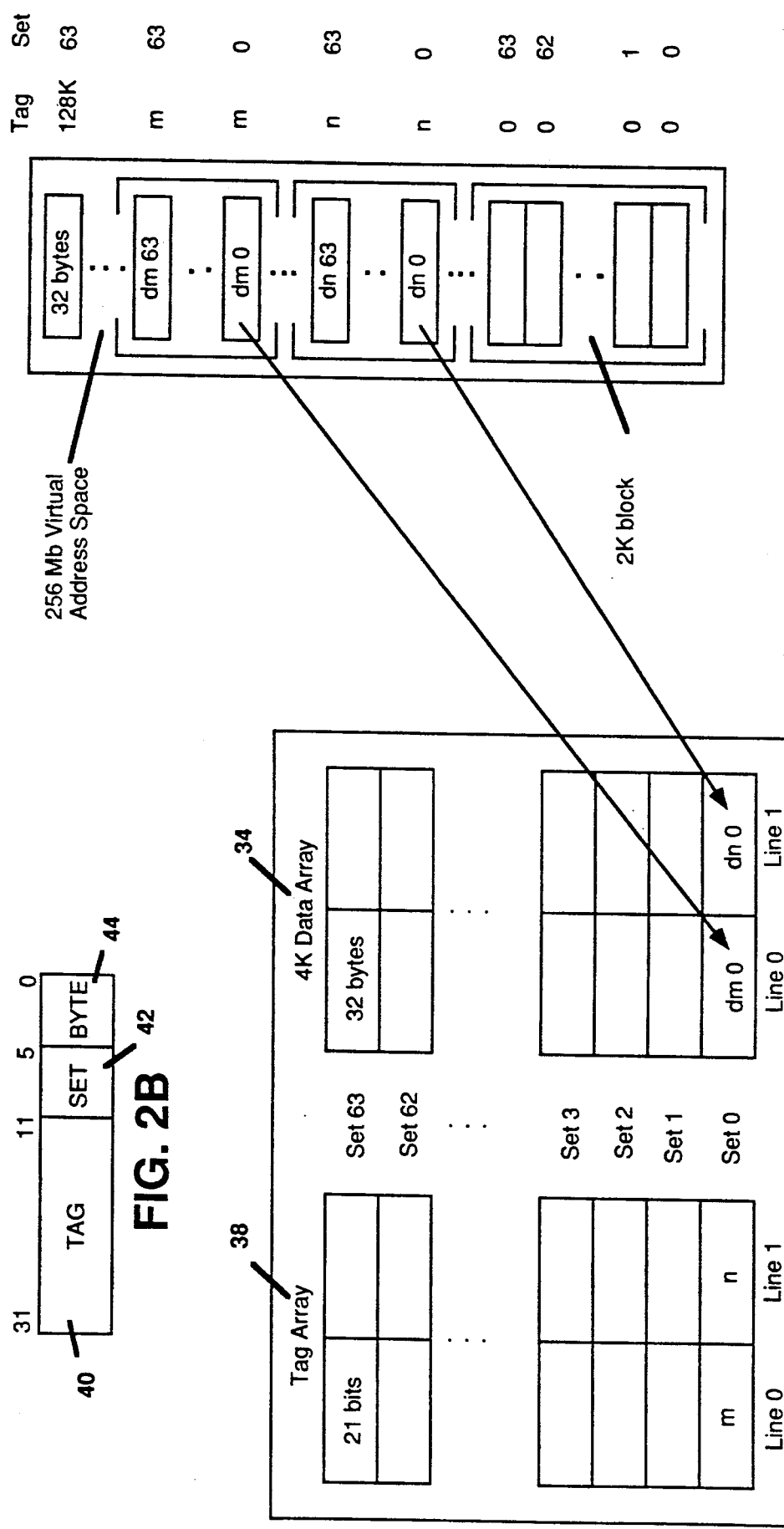
FIG. 2A is a block diagram illustrating the organization of an instruction cache unit used in the preferred embodiment of the present invention.
FIG. 2B is a diagram illustrating the virtual address of the instruction cache used in the preferred embodiment of the present invention.

FIG. 2A is a block diagram of the instruction cache 14 used in the preferred embodiment of the present invention. The instruction cache 14 is organized as a two-way set associative cache consisting of 64 sets, from set 0 to set 63 as shown in FIG. 2A. Each set contains two lines (or entries) of 32 bytes each for a total of 4K bytes. The cache, as illustrated in FIG. 2A, is not a user-addressable memory but serves only as a buffer for the main memory. In order to locate an element in the cache, it is necessary to have some function which maps the main memory address into a cache location. Set associative cache refers to a common technique to map function from main memory address to the cache location. See Smith, J. A., *Cache Memories* (ACM Computing Surveys: September, 1982), Volume 14, No. 3, pp. 473-530.

FIG. 2B is a block diagram of a virtual address for the instruction unit used in the preferred embodiment of the present invention. The virtual address of the instruction cache 14 is 32 bits long and comprises 3 fields, tag address 40, set index 42, and a line byte address 44. The tag address 40 points to an array of tags 38 which contains the bits of the tag address for the data residing in each of the two lines for every set in data array 34. The line byte address 44 is used to address inside the cache lines. In the preferred embodiment of the present invention, the line size is 32 bytes.

Like the integer execution unit 10 which features an instruction pipeline, the instruction cache 14 supports a four different cycles, Fetch, Replace, Flush, and Null. During a Fetch cycle, the tag array 38 and the data array 34 are read simultaneously. The stored tags for both lines in the selected set are compared against the requested tag address. If tag array 38 matches and the valid bit for that line is set, then a cache hit occurs. The match information is used to select the appropriate line in the data array 34 for latching the data to either the integer unit 10 or the floating point control unit 12. In the case of a cache miss, the address latches are frozen, and the bus control unit 20 then initiates cache miss processing. This comprises four replace cycles to bring the requested instruction from external memory into the instruction cache 14.

Replace cycle occurs immediately after Fetch misses. The tag address 40 and the set index 42 in FIG. 2B which cause the cache miss is saved in the address latch to be used during the replace cycle. One of the two lines in the selected sets is randomly chosen to be replaced. Four replaced cycles are required to write the 32 bytes into a line. During each cycle, the incoming instructions are simultaneously bypassed to the integer execution unit 10 and the floating point control unit 12. During each replace cycle, the tag array 38 and the data array 34 are simultaneously written. The tag array 38 is written with the saved tag address and the valid bit is set. The data array 34 is written with the incoming instruction from the external memory.

During a flush, the tag valid bit for all sets and lines is reset. All data in the instruction cache 14 is now invalid. Whenever any given set is first accessed after flush, a cache miss is guaranteed to occur. A flush cycle can occur during a Fetch or Replace cycle. In case of a Fetch, an instruction hit is forced high whether or not a hit truly resulted. In case of a Replace cycle, the valid bit for the set being replaced would be simultaneously written and reset. The reset wins out, invalidating the newly loaded data.

During a Null cycle, the tag array 38 and the data array 34 are not accessed.

A Fetch requested by the bus control unit 20 may be cancelled by the integer execution unit 10 with an abort cycle. In that case, the cycle proceeds as normal except that the data output latches are never reset and loaded with new data. Replace and flush cycles cannot be aborted, however.

A cache's external fetching algorithm determines when instructions are copied from an external memory into a line of the cache. Instructions can be externally fetched on demand (when they are needed) or pre-fetched (before they are needed). The instruction cache 14 used in the preferred embodiment of the present invention uses demand fetch for loading instruction into the cache. See Smith J. A. *Cache Memories* (ACM Computing Surveys: September, 1982), Volume 14, No. 3, pp. 473-530. Demand fetch simplifies the external fetching logic and eliminates pre-fetch interference with normal cache miss processing. Wraparound loading is used during a demand fetch. Because a line of data contains 32 bytes, an external fetch for line fill requires four 8-byte external memory reads. Using wraparound loading means that the external memory reads begin with the 8-byte word containing the address which generated the cache miss. The external read then continues at the higher address until the end of the line is reached, the wraps around to the beginning of the line, and then continues until the cache miss address is reached.

A cache's replacement algorithm determines which of the lines in a given set is replaced during cache miss processing. The line can be chosen at random or chosen according to which was Least Recently Used (LRU). The instruction cache 14 used in the preferred embodiment of the present invention uses random placement to switch off the two lines in a given set to replace during cache miss processing. A one bit counter supplied by the bus control unit 20 is used to make the selection.

Figure 3:
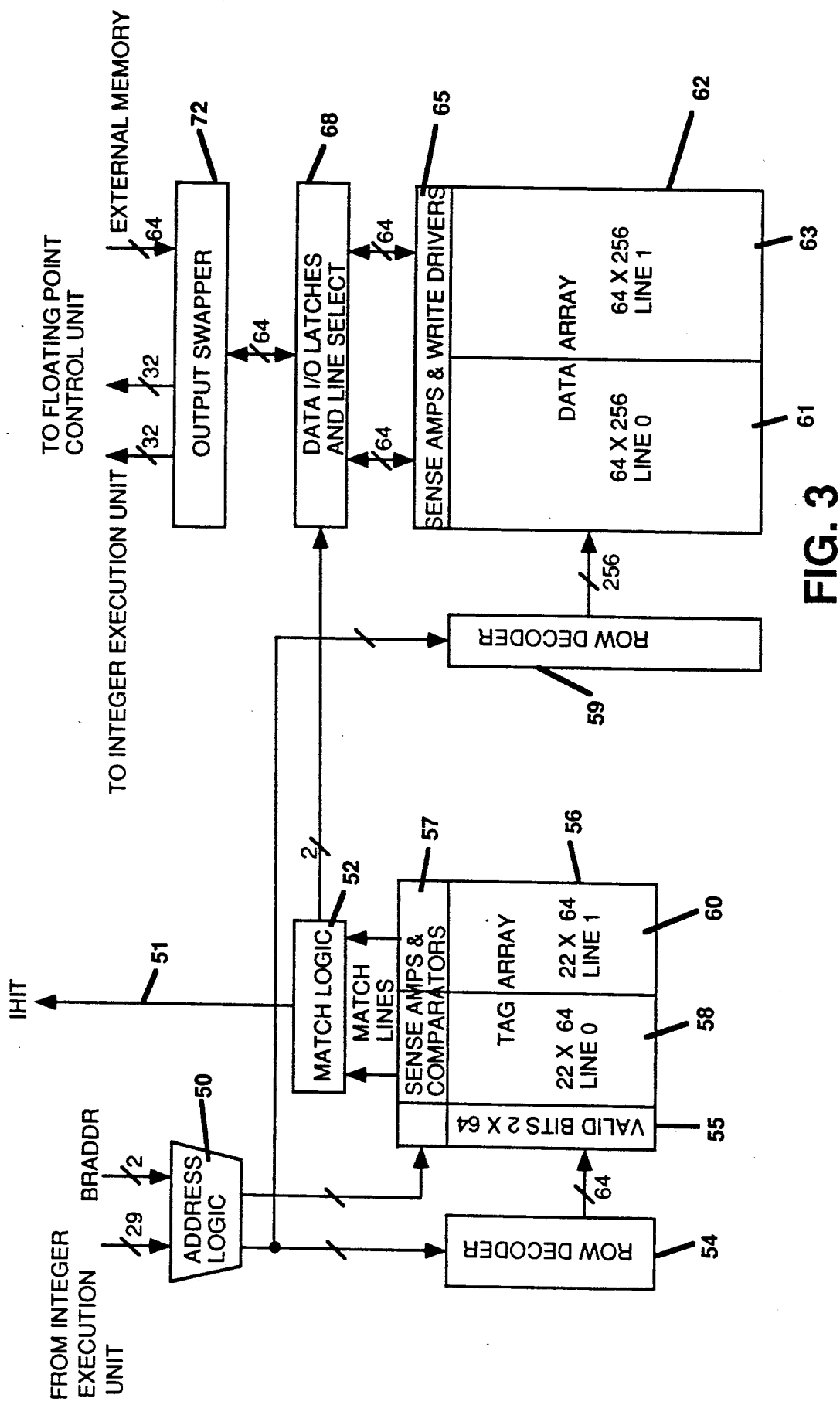
FIG. 3 is a block diagram of an instruction cache used in the preferred embodiment of the present invention.

FIG. 3 is a logic block diagram of the instruction cache 14 for use in the preferred embodiment of the present invention. The instruction cache 14 comprises address logic 50 and match logic 52, a tag array 60, a data array 62 and an output swapper 72. The address logic 50 of the instruction cache 14 is coupled to the integer execution unit 10 for receiving address locations therefrom. BRADDR is coupled to the Bus Control Unit 20, and its function is described below. The address logic 50 is coupled to row decoder 54 of the tag array 56 and row decoder 59 of the data array 62, respectively. The row addresses of the tag and data array are generated when the address logic 50 receives the appropriate signal from the integer execution unit. In similar fashion, the address logic 50 is coupled to the sense amplifier and comparators 57 of the tag array 56. The tag and data array addresses are formed by latching and multiplexing both the appropriate signals from the integer unit 10 and the BRADDR. During a Fetch cycle, only the signal from the integer execution unit coupled to the address logic 50 are used to from the tag and data array addresses. During a Replace cycle, BRADDR overrides the signal from the integer execution unit to force the selection of one of the two data arrays in the set being replaced. In addition to generating the appropriate row and comparator addresses for the tag and data array, the address logic 50 also generates a read and/or write accesses of the tag and data arrays. Moreover, cycle abort and output multiplexing and bypasses are also generated by the address logic 50.

The tag array 56 comprises static array random access memory (SRAM) array. The array comprises 44 columns by 64 rows and holds two 22-bit tag addresses for each of the 64 sets in the instruction cache. A valid bit 55 comprises two rows of resettable SRAM bits. Each line of each set has one valid bit. Comparator 57 of tag array 56 comprises an array of 46 comparators, 23 for each line in the set during a fetch cycle to store a tag address bits for each of the two lines are compared against the requested tag address bits. If either matches, and its valid bit 55 is set, then a cache hit occurs. Otherwise a cache miss occurs. Match logic 52 is coupled to the tag array 56 for generating an instruction cache hit (IHIT) signal 51. IHIT 51 is coupled to the other units in the processor for issuing freeze signal. The match logic 52 of the tag array 56 is further coupled to the data i/o latches and line select 68 of the data array 62. The match logic 52 directs the data array line select 68 during fetch cycles. The IHIT 51 is normally high, but will go low during a valid fetch cycle which results in an instruction cache miss. A fetch cycle is valid if it has not been aborted or overriden by a flush cycle. The tag array 56 stores the tag addresses of the instructions loaded in the data array and performs tag look-up and compares during fetch cycles.

The data array 62 comprises static random access memory (SRAM) array. The array further comprises 128 columns by 256 rows. Each set occupies four words lines, allowing two lines of 32 bytes per set. A plurality of sense amplifiers 65 is coupled to the data array line select 68. The sense amplifier 65 comprises 128 sense amplifiers, 64 for each cache line. During a fetch cycle, the match information from the tag array determined which lines sense data go to the output latches. Four 64-output latches drive the internal bus which is coupled to the integer execution unit 10 and the floating point control unit 12. The data array 62 is coupled to an output swapper 72 over the data array line select 68. The data array 62 further contains the instruction for the integer execution unit 10 and the floating point control unit 12. During a fetch cycle, it outputs its data (instructions) through the output swapper 72. During a replace cycle, it accepts its input data from the bus control unit 20.

Figure 4:
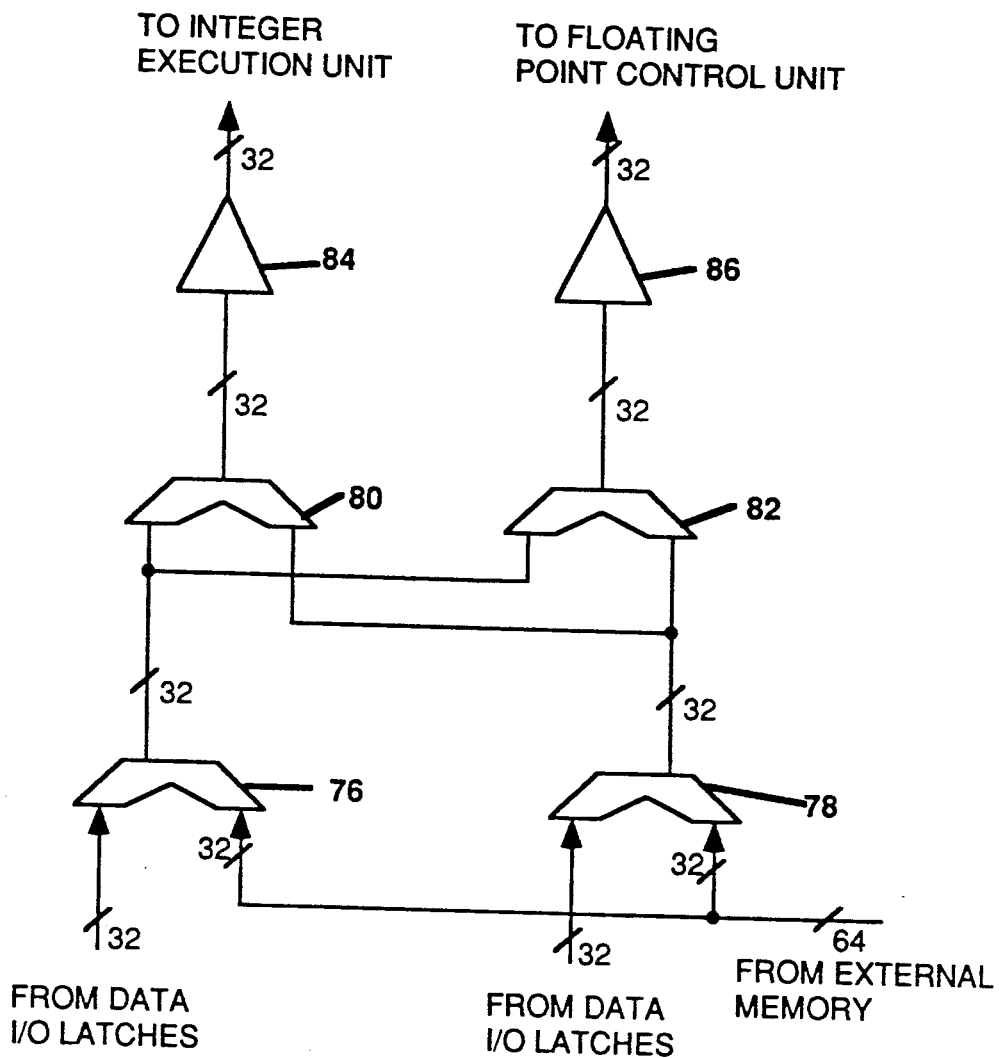
FIG. 4 is a circuit diagram of the swapper used in the preferred embodiment of the present invention.

FIG. 4 is circuit diagram of the output swapper used in the preferred embodiment of the present invention. The output swapper 72 comprises two tiers of multiplexers 76, 78, 80 and 82, respectively and the data output buffers 84 and 86, respectively. During a fetch cycle, the output swapper 72 transfers data from the data array line select onwards to the integer execution unit 10 and to floating point control unit 12. During a replace cycle, the instructions are fetched from external memory via bus control unit 20 and brought to the data array 62. The swapper directs the 64-bit external data bus to the data array input latches and also onto the integer execution unit and floating point control unit buses. As such, the output swapper 72 allows the incoming instruction to be simultaneously written into the instruction cache 14 and sent to the execution unit 10.

INSTRUCTION CACHE TESTING PROGRAM

The instruction cache test instruction (ITEST) is provided for testing the instruction cache data array. The test program comprises pairs of 32-bit ITEST instructions and checkerboard (or complement checkerboard) patterns forming 64-bit instructions. The ITEST instruction has a format as follows in the data array 62:

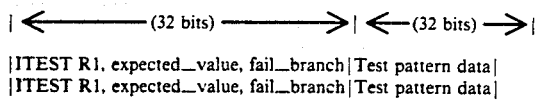

```
|<————————(32 bits)————————>|<—(32 bits)—>|
|ITEST R1, expected_value, fail_branch|Test pattern data|
|ITEST R1, expected_value, fail_branch|Test pattern data|
```

The data array 62 is partitioned into two halves: one half 61 and the other half 63, respectively, as shown in FIG. 3. The pairs of 32-bit ITEST instructions and checkerboards are loaded into the data array 62. The ITEST instruction runs in dual instruction mode with the floating point instruction replaced by the test pattern. The first time the ITEST instruction is executed, each instruction will be a cache miss and the data array 62 is filled with the ITEST instructions and test patterns. For example, the partition 61 of the data array 62 is filled with data patterns, and ITEST instructions. The second time the program is executed, each ITEST transfers its 32 bits of test pattern data from the instruction cache data array 62 to the R1 register of the instruction integer execution unit 10 via the floating point control unit 12 and then compare that data with the expected value (located in some register other than R1). If any comparison fails, then a defect in the data array 62 will have been detected. To fully cover the data array the program must be repeated with the test pattern located in the other half of each dual instruction and the instruction cache. This is accomplished when the output swapper 72 in FIG. 3 swaps the test pattern data in partition 62 with the ITEST instructions in partition 61 of the data array 62.

It follows from the above description that the swapper circuit and the ITEST instruction permit the user to test the integrity of a semiconductor memory storing controlled information with a minimum hardware overhead and a simple instruction.

While the present invention has been particularly described with reference to FIGS. 1-4 and with emphasis on certain circuits and instructions, it should be understood that the figures are for illustration only and should not be taken as limitations upon the invention. In addition, it is clear that the method and apparatus of the present invention has utility in any applications where the testing of semiconductor memory in a processor is required. It is comtemplated that many changes and modifications may be made by one of ordinary skill in the art without departing from the spirit and scope of the invention as disclosed above.

I claim:

1. A method of testing the integrity of an instruction cache of a microprocessor, comprising:
   (a) dividing a data array of the instruction cache into a first partition and a second partition, wherein the first partition includes a first memory location and the second partition includes a second memory location;
   (b) loading an instruction-test instruction into the first memory location of the first partition and a test pattern into the second memory location of the second partition;
   (c) applying the instruction-test instruction to an execution unit of the microprocessor and the test pattern to a control unit of the microprocessor;
   (d) comparing the test pattern with a predetermined value;
   (e) if the test pattern does not match the predetermined value, then issuing a signal indicative of a failure and stopping the testing, wherein the steps (c)-(e) are controlled by the instruction-test instruction; and
   (f) if the test pattern matches the predetermined value, then performing a swap operation by loading the instruction-test instruction into the second memory location of second partition and the test pattern into the first memory location of the first partition and performing the following steps;
      (i) applying the instruction-test instruction from the second memory location of second partition to the execution unit of the microprocessor and the test pattern from the first memory location of the first partition to the control unit of the microprocessor;
      (ii) comparing the test pattern read from the first memory location of the first partition with the predetermined value;
      (iii) if the test pattern does not match the predetermined value, then issuing a signal indicative of a failure, wherein the steps (i)-(iii) are controlled by the instruction-test instruction.

2. The method of claim 1, wherein the steps (c)-(e) are executed in a dual instruction mode of the microprocessor.

3. The method of claim 1, wherein the execution unit is an integer execution unit and the control unit is a floating point control unit.

4. An instruction cache of a microprocessor, comprising:
   (A) a data array having a first partition and a second partition;
   (B) instruction-test instruction means stored in the data array for testing integrity of the data array, wherein the instruction-test instruction means includes (1) an instruction-test instruction stored at the first partition and (2) a test pattern stored at the second partition, wherein the instruction-test instruction means is operated in a dual instruction mode; and
   (C) output swapper means coupled to (1) the data array for receiving the instruction-test instruction and the test pattern from the data array, and to (2) an integer execution unit of the microprocessor and a floating point control unit of the microprocessor for selectively coupling the instruction-test instruction to the integer execution unit and the test pattern to the floating point control unit, wherein the instruction-test instruction controls the output swapper means to selectively couple the instruction-test instruction to the integer execution unit and the test pattern to the floating point control unit, wherein the instruction-test instruction causes the integer execution unit to compare the test pattern in the floating control unit with a predetermined value, wherein the integer execution unit issues a signal indicative of a failure if the test pattern does not match the predetermined value.

5. The instruction cache of claims 4, further comprising a fail register having a first state which indicates that a defect in the data array is tested, wherein the fail register is in the first state when the comparison of the test pattern and the predetermined value results in a mismatch.

6. The instruction cache of claim 4, wherein the output swapper means simultaneously couples the instruction-test instruction to the integer execution unit and the test pattern to the floating point control unit in the dual instruction mode.

7. A method of testing the integrity of an instruction cache of a microprocessor, comprising:

(a) dividing a data array of the instruction cache into a first partition and a second partition, wherein the first partition includes a first plurality of memory locations, including a first memory location, wherein the second partition includes a second plurality of memory locations, including a second memory location;

(b) loading an instruction-test instruction into each of the first plurality of memory locations in the first partition, and loading a test pattern into each of the second plurality of memory locations in the second partition;

(c) applying the instruction-test instruction from the first memory location in the first partition to an execution unit of the microprocessor and the test pattern from second memory location in the second partition to a control unit of the microprocessor;

(d) comparing the test pattern with a predetermined value;

(e) if the test pattern does not match the predetermined value, then issuing a signal indicative of a failure and stopping the testing, wherein steps (c)-(e) are controlled by the instruction-test instruction;

(f) if the test pattern matches the predetermined value, then repeating steps (c)-(e) until the second partition has been tested entirely, wherein upon each repetition, a next one of the first plurality of memory locations in the first partition becomes the first memory location, and a next one of the second plurality of memory locations in the second partition becomes the second memory location; and (g) if the second partition has been tested entirely, then performing a swap operation by loading the instruction-test instruction into the second plurality of memory locations of the second partition and loading the test pattern into the first plurality of memory locations of the first partition and performing the following steps:

(i) applying the instruction-test instruction from the second memory location of the second partition to the execution unit of the microprocessor and the test pattern from the first memory location of the first partition to the control unit of the microprocessor;

(ii) comparing the test pattern read from the the first memory location of the first partition with the predetermined value;

(iii) if the test pattern does not match the predetermined value, then issuing a signal indicative of a failure and stopping the testing, wherein the steps (i)-(iii) are controlled by the instruction-test instruction; and (iv) if the test pattern matches the predetermined value, then repeating the steps (i)-(iii) until the first partition has been tested entirely, wherein upon each repetition, a next one of the first plurality of memory locations in the first partition becomes the first memory location, and a next one of the second plurality of memory locations in the second partition becomes the second memory location.

* * * * *

UNITED STATES PATENT AND TRADEMARK OFFICE
CERTIFICATE OF CORRECTION

PATENT NO. : 5,073,891
DATED : Dec. 17, 1991
INVENTOR(S) : Piyush G. Patel

It is certified that error appears in the above-indentified patent and that said Letters Patent is hereby corrected as shown below:

Col. 7, Line 30  Delete "62"        Insert --61--

Signed and Sealed this

Twenty-fourth Day of May, 1994

*Attest:*

BRUCE LEHMAN

*Attesting Officer*    *Commissioner of Patents and Trademarks*